US009478282B2

United States Patent
Bedeschi

(10) Patent No.: US 9,478,282 B2
(45) Date of Patent: *Oct. 25, 2016

(54) STATE DETERMINATION IN RESISTANCE VARIABLE MEMORY

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/656,908

(22) Filed: Mar. 13, 2015

(65) Prior Publication Data

US 2015/0187416 A1  Jul. 2, 2015

Related U.S. Application Data

(63) Continuation of application No. 14/109,329, filed on Dec. 17, 2013, now Pat. No. 9,019,754.

(51) Int. Cl.
*G11C 13/00* (2006.01)
*G11C 11/16* (2006.01)
(Continued)

(52) U.S. Cl.
CPC ............ *G11C 13/0035* (2013.01); *G11C 7/06* (2013.01); *G11C 11/1673* (2013.01); *G11C 11/5607* (2013.01); *G11C 13/0002* (2013.01); *G11C 13/004* (2013.01); *G11C 2013/0045* (2013.01); *G11C 2013/0047* (2013.01); *G11C 2013/0057* (2013.01)

(58) Field of Classification Search
CPC ........................ G11C 13/0035; G11C 11/1673

USPC .................................................. 365/148, 207
See application file for complete search history.

(56) References Cited

U.S. PATENT DOCUMENTS 8,107,280 B2   1/2012   Yoon et al.
8,259,525 B2   9/2012   Lowrey et al.
(Continued)

FOREIGN PATENT DOCUMENTS

EP     2073285 A2    6/2009

OTHER PUBLICATIONS

Bedeschi et al., A Multi-Level-Cell Bipolar-Selected Phase-Change Memory, ISSCC 2008, Session 23, Non-Volatile Memory, 23.5, 2008 IEEE Int. Solid-State Circuits Conference, pp. 427-429, (2008).

(Continued)

*Primary Examiner* — Hoai V Ho
(74) *Attorney, Agent, or Firm* — TraskBritt

(57) ABSTRACT

An evaluation signal is applied to a memory cell in an array of resistance variable memory cells. The evaluation signal is configured to cause the memory cell to switch from a first state to a second state. Responses from the memory cell are sensed at three or more sample points. Differences between the responses are determined. For example, with three sample points, a first delta is determined between the first two responses and a second delta is determined between the last two responses. A difference of deltas is determined as a difference between the first and second delta, or vice versa. It is determined that the memory cell changes from the first to the second state if the difference of deltas is above a threshold. It is determined that the memory cell remains in the second state if the difference of deltas is below the threshold.

21 Claims, 8 Drawing Sheets

(51) Int. Cl.
  *G11C 11/56* (2006.01)
  *G11C 7/06* (2006.01)

(56) References Cited

U.S. PATENT DOCUMENTS

| | | |
|---|---|---|
| 8,300,454 B2 | 10/2012 | Kramer et al. |
| 8,310,868 B2 | 11/2012 | Kram et al. |
| 8,320,167 B2 | 11/2012 | Rao et al. |
| 8,358,531 B2 | 1/2013 | Liu et al. |
| 8,358,534 B2 | 1/2013 | Kramer et al. |
| 8,467,237 B2 | 6/2013 | Bedeschi et al. |
| 8,472,240 B2 | 6/2013 | Liu et al. |
| 8,472,244 B2 | 6/2013 | Kramer et al. |
| 8,503,227 B2 | 8/2013 | Liu et al. |
| 8,510,628 B2 | 8/2013 | Bedeschi et al. |
| 8,525,709 B2 | 9/2013 | Venkatraman et al. |
| 8,546,778 B2 | 10/2013 | Zanderigo et al. |
| 8,553,449 B2 | 10/2013 | Liu et al. |
| 8,553,451 B2 | 10/2013 | Liu et al. |
| 9,019,754 B1 * | 4/2015 | Bedeschi ............ G11C 13/004 365/148 |
| 2005/0195647 A1 | 9/2005 | Perner |
| 2008/0219044 A1 | 9/2008 | Yoon et al. |
| 2009/0103354 A1 | 4/2009 | Yoon et al. |
| 2011/0273926 A1 | 11/2011 | Wu et al. |
| 2012/0275218 A1 | 11/2012 | Liu et al. |
| 2012/0287698 A1 | 11/2012 | Lowrey et al. |
| 2012/0294077 A1 | 11/2012 | Liu et al. |
| 2013/0001501 A1 | 1/2013 | Sills |
| 2013/0064011 A1 | 3/2013 | Liu et al. |
| 2013/0126997 A1 | 5/2013 | Liu et al. |
| 2013/0128657 A1 | 5/2013 | Alam et al. |
| 2013/0140615 A1 | 6/2013 | Kramer et al. |
| 2013/0175644 A1 | 7/2013 | Horng et al. |
| 2013/0181183 A1 | 7/2013 | Pellizzer et al. |
| 2014/0177335 A1 | 6/2014 | Xu |

OTHER PUBLICATIONS

Kund et al., Conductive Bridging RAM (CBRAM): An Emerging Non-Volatile Memory Technology Scalable to Sub 20nm, IEEE EIDM Tech. Dig. pp. 754-757, (2005).

* cited by examiner

US 9,478,282 B2

STATE DETERMINATION IN RESISTANCE VARIABLE MEMORY

CROSS-REFERENCE TO RELATED APPLICATION

This application is a continuation of U.S. patent application Ser. No. 14/109,329, filed Dec. 17, 2013, now U.S. Pat. No. 9,019,754 issued Apr. 28, 2015, the disclosure of which is hereby incorporated herein in its entirety by this reference.

TECHNICAL FIELD

The present disclosure relates generally to apparatuses, such as semiconductor memory devices, systems, and controllers, and related methods, and more particularly, to determining values of resistance variable memory cells.

BACKGROUND

Memory devices are typically provided as internal, semiconductor, integrated circuits and/or external removable devices in computers or other electronic devices. There are many different types of memory including Random Access Memory (RAM), Read Only Memory (ROM), Dynamic Random Access Memory (DRAM), Synchronous DRAM (SDRAM), Flash memory, and resistance variable memory, among others. Types of resistance variable memory include memories such as programmable conductor memory, Phase Change Random Access Memory (PCRAM), Resistive Random Access Memory (RRAM), Magnetoresistive Random Access Memory (MRAM; also referred to as magnetic random access memory), Conductive-Bridging Random Access Memory (CBRAM), and Spin Torque Transfer Random Access Memory (STT RAM), among others.

Non-volatile memory may be used in, for example, personal computers, portable memory sticks, solid state drives (SSDs), personal digital assistants (PDAs), tablets, digital cameras, cellular telephones, portable music players (e.g., MP3 players), and movie players, among other electronic devices. Some types of data, such as program code, user data, and system data, such as a basic input/output system (BIOS), are typically stored in non-volatile memory devices.

Resistance variable memory, such as RRAM or STT RAM, includes resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying a programming signal to the resistance variable memory cells. Programming signals can include applying sources of energy (e.g., an electrical field or magnetic field), such as by applying positive or negative electrical signals (e.g., positive or negative voltage or current signals) to the memory cells for a particular duration. Moreover, these applied signals may have particular shapes, such as pulses, ramps, sinusoids, and other suitable shapes.

A resistance variable memory cell can be programmed to one of a number of data states. For example, a single level cell (SLC) may be programmed to one of two data states, a low resistance state that corresponds to a set data state (e.g., logic 1), or a high resistance state that corresponds to a reset data state (e.g., logic 0). The data state of the memory cell can depend on whether the cell is programmed to a resistance above or below a particular level. As an additional example, various resistance variable memory cells can be programmed to one of multiple different data states corresponding to different resistance levels. Such cells may be referred to as multi-state cells, multi-digit cells, or multi-level cells (MLCs), and can represent multiple binary digits of data (e.g., 10, 01, 00, 11, 111, 101, 100, 1010, 1111, 0101, 0001, etc.).

In some instances, a sensing operation used to determine the data state of a resistance variable memory cell may incorrectly determine the data state of the resistance variable memory cell. A memory cell can be sensed by comparing an electrical parameter of the memory cell to an electrical parameter of another memory cell or combination of memory cells that are reference memory cell(s). For example, the current flowing into the memory cell in some defined bias condition may be compared to the current flowing into a reference memory cell in the same bias conditions. The memory cell is then declared to be in a specific logic state depending on whether the current in the memory cell is greater than or less than the current in the reference memory cell. This sensing operation can be fast and simple, but may result in sensing errors. For example, a signal associated with the memory cell during a sensing operation may or may not correspond to a data state to which the memory cell was programmed, thus resulting in sensing an incorrect data state for the memory cell. Thus, improvements in detecting the data state of resistance variable memory are desired.

DETAILED DESCRIPTION

Figure 1:
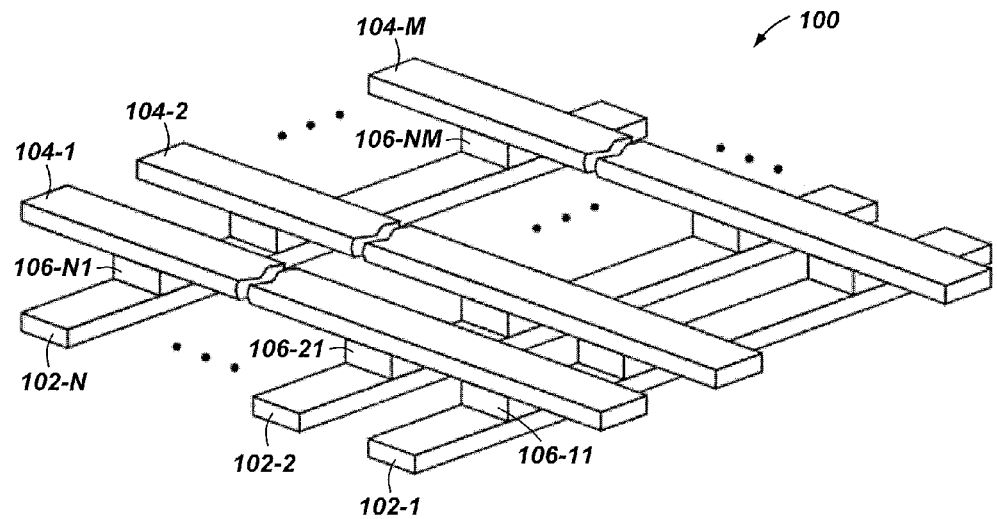
FIG. 1 is a diagram of a portion of an array of resistance variable memory cells according to embodiments of the present disclosure.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, the phrase "semiconductor device structure" means and includes a structure, device, or system used in the formation of a semiconductor device and which may or may not be present in the semiconductor device in its final form. For example, a semiconductor device structure may be an intermediate structure present in the formation of a semiconductor device or system or a final structure comprising at least a portion of a semiconductor device or system. "Semiconductor device structure" encompasses structures for memory, logic, solar cells, light-emitting diodes (LEDs), processors, imaging devices, and other devices and systems that may or may not include one or more semiconductor materials.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

In the following description, elements, circuits, modules, and functions may be shown in block diagram form in order not to obscure the present disclosure in unnecessary detail. Moreover, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus for carrying the signals, wherein the bus may have a variety of bit widths.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numerical indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

The present disclosure includes apparatuses and methods for determining the state of a resistance variable memory cell by applying an evaluation signal to the memory cell, sensing responses of the memory cell, and analyzing the responses.

In this description significant detail has been presented for STT RAM cells as one example of a resistance variable memory cell that may be used in embodiments of the present disclosure. However, embodiments are not so limited. Embodiments of the present disclosure may be used with many types of resistance variable memory cells that exhibit different resistance levels for different data states and that will switch from one resistance level to another resistance level in response to an evaluation signal for at least one of the data states.

Thus, in some embodiments, a method for sensing a resistance variable memory cell can include applying an evaluation signal to a resistance variable memory cell in an array of resistance variable memory cells. The evaluation signal is configured to cause the memory cell to switch from a first data state to a second data state at a threshold current. Three or more responses from the memory cell are sensed responsive to the evaluation signal at three or more sample points. Differences between at least three of the three or more responses are determined. The method determines that the memory cell changes from the first data state to the second data state during application of the evaluation signal responsive to the differences being above a predetermined threshold. The method also determines that the memory cell remains in the second data state responsive to the differences being below a predefined threshold.

In some embodiments, an apparatus can include an array of resistance variable memory cells and a controller coupled to the array. The controller is configured to apply an evaluation signal to a resistance variable memory cell in the array of resistance variable memory cells. The controller is also configured to sense three or more responses from the resistance variable memory cell responsive to the evaluation signal at three or more sample points. The controller is also configured to determine whether the resistance variable memory cell changes from an initial data state to a different data state during application of the evaluation signal responsive to differences between at least three of the three or more responses.

FIG. 1 is a diagram of a portion of an array 100 of resistance variable memory cells 106 according to embodiments of the present disclosure. In the example illustrated in FIG. 1, the array 100 is a cross-point array having resistance variable memory cells 106 located at the intersections of a first number of conductive lines 102-1, 102-2, . . . , 102-N (e.g., access lines, which may also be referred to herein as word lines 102), and a second number of conductive lines 104-1, 104-2, . . . , 104-M (e.g., data sense lines, which may also be referred to herein as bit lines 104). As illustrated in FIG. 1, the word lines 102 are substantially parallel to each other and are substantially orthogonal to the bit lines 104, which are substantially parallel to each other; however, embodiments are not so limited. In the embodiment illustrated in FIG. 1, the resistance variable memory cells 106 (e.g., 106-11, 106-21, 106-N1, and 106-NM) can function in a two-terminal architecture with a particular word line 102 and a particular bit line 104 serving as a bottom electrode and top electrode, respectively, for the resistance variable memory cell 106. Depending on the memory technology, additional lines may be present in the array (e.g., a source line), that are not shown in FIG. 1.

Each resistance variable memory cell 106 can include a storage element (e.g., a resistance variable memory element) coupled to a select device (e.g., an access device, not shown in FIG. 1). The access device can be, for example, a diode or a transistor (e.g., a field effect transistor (FET) or bipolar junction transistor (BJT)), among others. The storage element can include a programmable portion that may have a variable resistance, for example. The resistance variable memory cell 106 can be a Spin Torque Transfer Random Access Memory (STT RAM) cell and include magnetic tunnel junction, for example. For instance, the storage element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of the resistance variable memory cells 106 can include various materials employing trapped charges to modify or alter conductivity, chalcogenides formed of various doped or undoped materials, binary metal oxide materials, colossal magnetoresistive materials, and/or various polymer based resistance variable materials, among others. Embodiments are not limited to a particular resistance variable material or materials. As such, the resistance variable memory cells 106 can be single level and/or multilevel Resistive Random Access Memory (RRAM) cells, Spin Torque Transfer Random Access Memory (STT RAM) cells, programmable conductor memory cells, Phase Change Random Access Memory (PCRAM) cells, Magnetoresistive Random Access Memory (MRAM) cells, and/or Conductive-Bridging Random Access Memory (CBRAM) cells, among various other types of resistance variable memory cells.

In operation, the resistance variable memory cells 106 of the array 100 can be programmed via programming signals (e.g., write voltage and/or current pulses) applied to the cells (e.g., the storage element of the cells) via selected word lines 102, bit lines 104, other suitable signals coupled to the resistance variable memory cells 106, and combinations thereof. The amplitude, shape, duration, and/or number of programming pulses, for example, applied to the resistance variable memory cells 106 can be adjusted (e.g., varied) in order to program the cells to one of a number of different resistance levels corresponding to particular data states.

In a number of embodiments, a single level resistance variable memory cell 106 may be programmed to one of two data states (e.g., logic 1 or 0). The resistance variable memory cell 106 may be programmed with a first programming signal, which will place the resistance variable memory cell 106 in a low resistance data state (e.g., logic 1) or the resistance variable memory cell 106 may be programmed with a second programming signal, which will place the resistance variable memory cell 106 in a relatively higher resistance data state (e.g., logic 0).

A sensing (e.g., read, program, verify, or evaluation) operation can be used to determine the data state of the resistance variable memory cell 106 by sensing (e.g., reading) a signal, for example, on the bit line 104 associated with the respective cell responsive to a particular signal applied to the word line 102 to which the selected cell is coupled. Sensing the signal associated with the respective cell can include sensing a voltage, a current, and an amplitude of such, among other characteristics of the signal. In a number of embodiments where the resistance variable memory cell 106 includes a three-terminal select device, the signal on the word line 102 can be used to select the resistance variable memory cell 106 and a signal through the resistance variable memory cell 106 can be changed by voltage difference between the bit line 104 and a source of the selected resistance variable memory cell 106 to vary the resistance level of the resistance variable memory cell 106, for example.

While the semiconductor devices and structures described herein by way of example may make specific reference to STT RAM devices, the disclosure is not so limited and may be applied to other semiconductor and memory devices. For example, embodiments of the disclosure may be implemented in PCM RAM devices, RRAM devices, MRAM devices, conductive bridging memory devices, or any semiconductor memory or system that may benefit from improved data state sensing.

Figure 2:
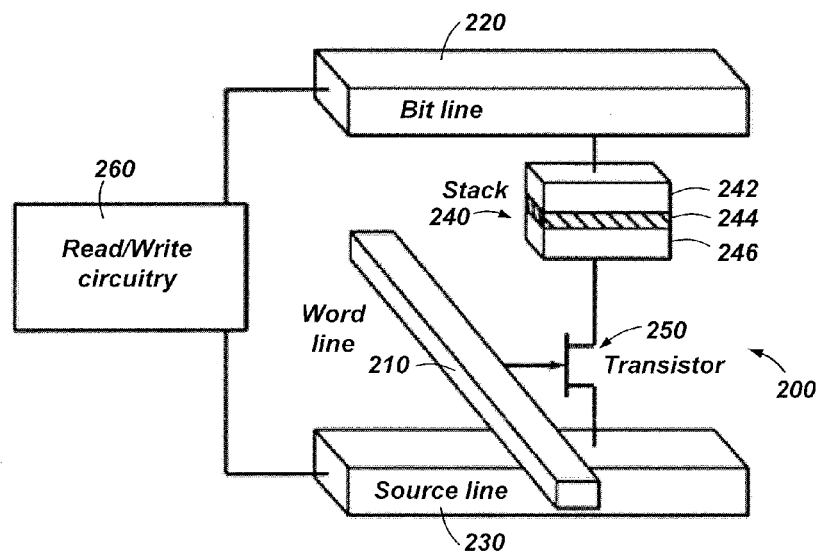
FIG. 2 illustrates an STT RAM cell according to embodiments of the present disclosure.

FIG. 2 illustrates an STT RAM cell 200 according to embodiments of the present disclosure. The STT RAM cell 200 may be fabricated to form an array 100 of resistance variable memory cells 106 (FIG. 1) in a grid pattern including a number of rows and columns, or in various other arrangements depending on the system requirements and fabrication technology. The STT RAM cell 200 includes a stack 240, an access transistor 250, a bit line 220, a word line 210, a source line 230, and read/write circuitry 260. The stack 240 may include a magnetic tunnel junction (MTJ), including a nonmagnetic layer 244 between a free layer 242, and a pinned layer 246. The stack 240 configured as a MTJ may also be referred to herein as a MTJ storage element 240.

As used herein, the STT RAM cell 200 generally includes a "magnetic cell structure." The magnetic cell structure may be a MTJ if the nonmagnetic layer 244 between the free layer 242 and the pinned layer 244 of the stack 240 is insulative. Alternatively, the magnetic cell structure may be a spin valve, if the nonmagnetic layer 244 between the free layer 242 and the pinned layer 246 is conductive. As used in the present description, the term "stack" may refer to a memory cell stack, magnetic cell stack, STT RAM cell stack, or any component of a memory cell that may include layers and materials in accordance with an embodiment of the present disclosure.

Figure 3A:
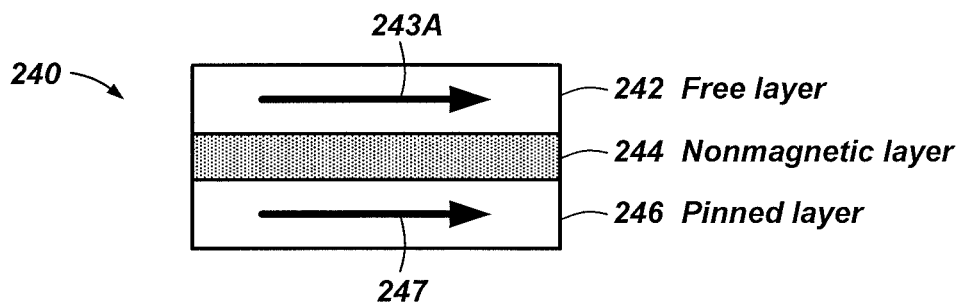
FIGS. 3A and 3B illustrate an example of states of magnetic layers in the STT RAM cell of FIG. 2.
Figure 3B:
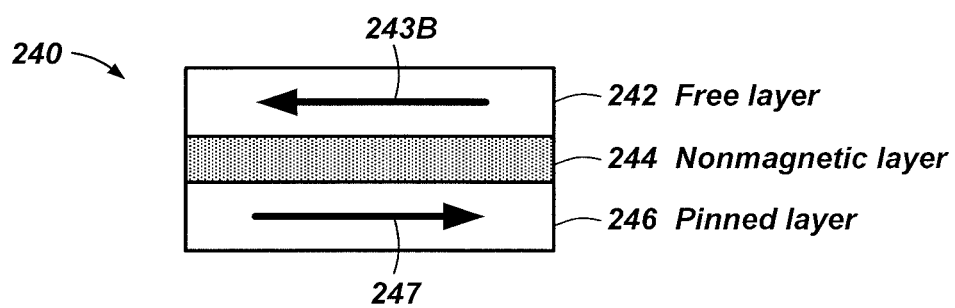

FIGS. 3A and 3B illustrate an example of states of magnetic layers in the STT RAM cell 200 of FIG. 2. As illustrated in FIGS. 3A and 3B, the MTJ storage element 240 can be formed from two magnetic layers (i.e., the pinned layer 246 and the free layer 242), each of which can hold a magnetic field. The two magnetic layers 242 and 246 are separated by a nonmagnetic layer 244. The pinned layer 246 may be configured to a particular magnetic polarity 247. The magnetic polarity 243 of the free layer 242, on the other hand, may be configured to change to match that of an external magnetic field that can be applied to the stack 240. A change in the magnetic polarity 243 of the free layer 242 will change the resistance of the MTJ storage element 240. For example, as shown in FIG. 3A, when the magnetic polarity 243A of the free layer 242 matches the magnetic polarity 247 of the pinned layer 246, a relatively low resistance state exists for the stack 240. In contrast, as shown in FIG. 3B, when the magnetic polarity 243B of the free layer 242 is not aligned with the magnetic polarity 247 of the pinned layer 246, a relatively high resistance state exists for the stack 240. FIGS. 3A and 3B illustrate one simple embodiment of a MTJ storage element 240, other embodiments may include additional layers and the orientation of the pinned layer 246 and the free layer 242 may be reversed.

Referring to FIGS. 2, 3A, and 3B, in a write operation the access transistor 250 may be turned off and the read/write circuitry 260 can apply a programming signal to the stack 240 by applying relative currents to the bit line 220 and the source line 230. The polarity of the voltage between the bit line 220 and the source line 230 can develop a magnetic field that may cause a switch in magnetization of the free layer 242 in the stack 240. Once the free layer 242 is magnetized according to the spin polarity of the programming current, the programmed state has been written into the STT RAM cell 200. In other words, the programming current may exert a torque on the free layer 242, which may switch the magnetization of the free layer 242. If the programming current causes the magnetic polarity 243A of the free layer 242 to be aligned (i.e., parallel) with the magnetic polarity 247 of the pinned layer 246, the STT RAM cell 200 will be in a relatively low resistance state (e.g., a logic 1). If the programming current causes the magnetic polarity 243B of the free layer 242 to be not aligned (i.e., anti-parallel) with the magnetic polarity 247 of the pinned layer 246, the STT RAM cell 200 will be in a relatively high resistance state (e.g., a logic 0).

In a read operation of the STT RAM cell 200, the access transistor 250 may be turned on by the word line 210 and an evaluation signal is applied to the stack 240 through the bit line 220 and the source line 230. Voltage responses of the stack 240 to the evaluation signal are used to determine whether the stack 240 is in a relatively low resistance state or a relatively high resistance state.

Figure 4A:
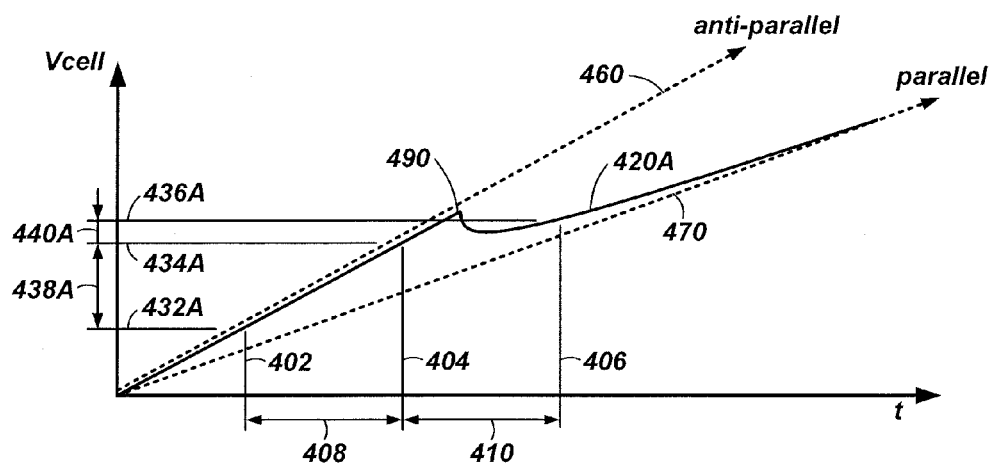
FIGS. 4A and 4B illustrate responses of an STT RAM cell to an applied evaluation signal.
Figure 4B:
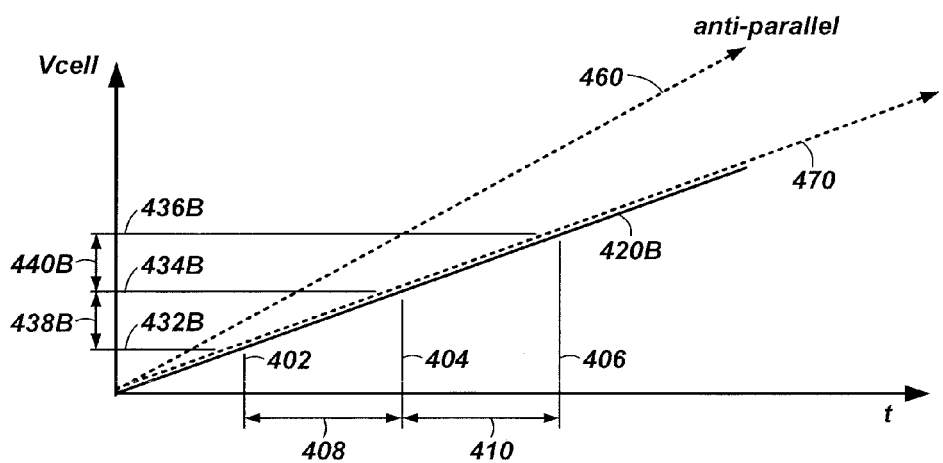

FIGS. 4A and 4B illustrate responses of an STT RAM cell 200 (FIG. 2) to an applied evaluation signal. The evaluation signal (not shown in FIGS. 4A and 4B) used for the responses of FIGS. 4A and 4B may be configured as a substantially linear current ramp applied to the STT RAM cell 200 wherein the current ramp is in a range that include a threshold current as explained below. The voltage response of the STT RAM cell 200 may be sensed at three or more sample points 402, 404, and 406 while the evaluation signal is being applied. In some embodiments, the sample points 402, 404, and 406 may be configured such that there is a substantially equal time period 408 and 410 between each sample point 402, 404, and 406.

A first dashed line 460 (also referred to as an ideal impedance line 460) indicates the ideal voltage response to the substantially linear current ramp applied to an STT RAM cell 200 programmed to an anti-parallel data state. A second dashed line 470 (also referred to as an ideal impedance line 470) indicates the ideal voltage response to the substantially linear current ramp applied to an STT RAM cell 200 programmed to a parallel data state.

FIG. 4A illustrates the response of the STT RAM cell 200 (FIG. 2) when it is in an anti-parallel data state before the evaluation signal is applied and switches to a parallel data state as a result of the applied evaluation signal. Initially, the voltage response 420A closely follows the ideal impedance line 460 of an anti-parallel data state of an STT RAM cell 200. At a certain current level 490, the STT RAM cell 200 will switch to a parallel data state and begin to follow the ideal impedance line 470 of a parallel data state of an STT RAM cell 200.

By sensing the voltage response at three or more sample points 402, 404, and 406, the initial state of the STT RAM cell 200 can be determined as long as two or more of the sample points 402 and 404 are taken before the switch to a parallel data state would occur and one or more of the sample points 406 are taken after the switch to a parallel data state would occur.

FIG. 4B illustrates the response of the STT RAM cell 200 (FIG. 2) when it is in a parallel data state before the evaluation signal is applied. Initially, the voltage response 420B closely follows the ideal impedance line 460 of a parallel data state of an STT RAM cell 200. Since the STT RAM cell 200 was already in the parallel data state, no switch will occur at current level 490 (FIG. 4A) and the voltage response of the STT RAM cell 200 will continue to follow the ideal impedance line 460 of a parallel data state at higher current levels of the evaluation signal.

Thus, at sample point 402 a first response 432B is sampled. At sample point 404, a second response 434B is sampled. At sample point 406, a third response 436B is sampled. One can determine a first delta 438B between the first response 432B and the second response 434B (alternatively, with the opposite sign, between the second response 434B and the first response 432B). Similarly, one can determine a second delta 440B between the second response 434B and the third response 436B (alternatively, with the opposite sign, between the third response 436B and the second response 434B). Because the voltage response 420B closely follows the ideal impedance line 470 and does not switch, the first delta 438B and the second delta 440B will be substantially equal.

Returning to FIG. 4A, at sample point 402 a first response 432A is sampled. At sample point 404, a second response 434A is sampled. At sample point 406, a third response 436A is sampled. One can determine a first delta 438A between the first response 432A and the second response 434A (alternatively, with the opposite sign, between the second response 434A and the first response 432A). Similarly, one can determine a second delta 440A between the second response 434A and the third response 436A (alternatively, with the opposite sign, between the third response 436A and the second response 434A). Because the voltage response 420A first follows the ideal impedance line 460 of an anti-parallel programming, then switches to follow the ideal impedance line 470 of a parallel programming, the first delta 438A and the second delta 440A will be substantially different.

In general, when discussing deltas and differences of deltas, they can be considered as absolute values or the sign intended will be clear to a person of ordinary skill in the art. Thus, in some cases a delta may be referred to as an absolute delta (i.e., an absolute value of the delta) and a difference may be referred to as an absolute difference (e.g., an absolute value of the difference).

In addition, the description of FIGS. 4A and 4B illustrate a switch from the anti-parallel state to the parallel state. In some embodiments, the opposite approach may also be used; in such a case an increase of slope (instead of a decrease) would occur at a state switch from the parallel state to the anti-parallel state, or would remain unchanged if the cell is already in the target state.

Figure 5:
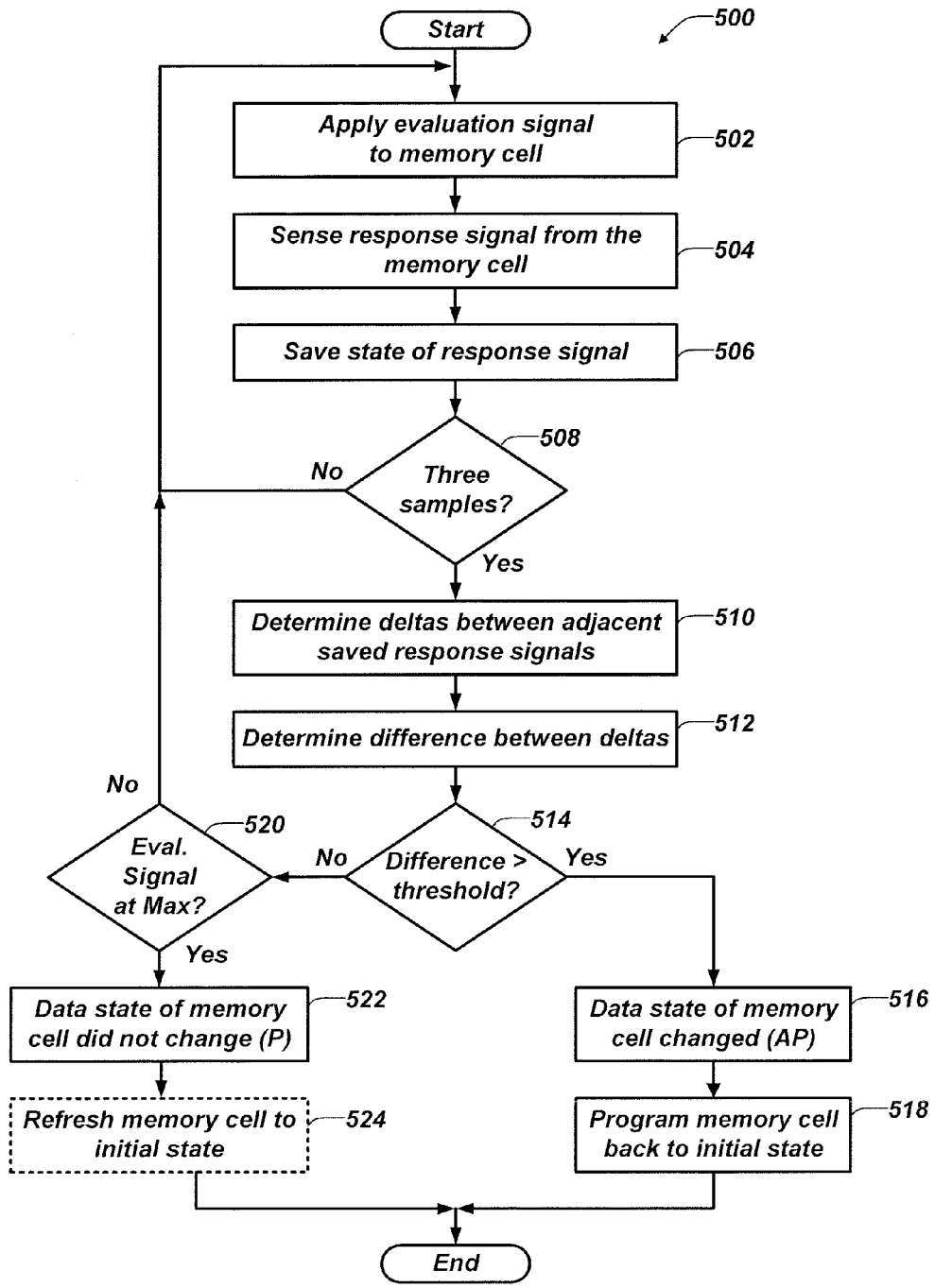
FIG. 5 illustrates a process for determining a data state of resistance variable memory cells according to embodiments of the present disclosure.

FIG. 5 illustrates a process 500 for determining a data state of resistance variable memory cells according to embodiments of the present disclosure. Referring to FIGS. 4A, 4B, and 5, the process begins by applying an evaluation signal to the memory cell at operation 502. In the embodiment discussed in FIGS. 4A and 4B, the evaluation signal would have a substantially constant current ramp. At operation 504, a response of the memory cell is sensed. At operation 506, the state of the response signal is saved. As a non-limiting example, the response may be in the form of an analog voltage that is capacitively stored as explained more fully below in connection with FIG. 9A. As another non-limiting example, the response may be in the form of an analog voltage that is converted to a digital signal and digitally stored as explained more fully below in connection with FIG. 9B. Operation 508 indicates that a decision is made on whether there have been three or more samples collected.

The process 500 uses three or more sample points, which are captured using a loop, defined by operations 502, 504, 506, and 508. Thus, on a first time through the loop, at sample point 402, the first response (432A, 432B) is sensed and stored. On a second time through the loop, at sample point 404, the second response (434A, 434B) is sensed and stored. On a third time through the loop, at sample point 406, the third response (436A, 436B) is sensed and stored. In the embodiment discussed in FIGS. 4A and 4B, these sample points are substantially equidistant in time.

After three samples have been collected, operation 510 indicates that the deltas between adjacent saved response signals are determined. Additional details on this process are discussed below in combination with FIGS. 9A and 9B. Thus, for the embodiment discussed in FIGS. 4A and 4B the first delta (438A, 438B) and the second delta (440A, 440B) are determined. In some embodiments, one of the responses (e.g., the second response 434) would be common to both the determination of the first delta (438A, 438B) and the second delta (440A, 440B). In addition, some embodiments may perform this delta determination whenever the two appropriate response signals are available. Thus, on the second pass through loop 502, 504, 506, and 508, the first response (432A, 432B) would be available and the second response (434A, 434B) would be available. As a result, the difference of operation 510 could be performed to get the first delta (438A, 438B) at that point, before the third response (436A, 436B) has been sensed or saved. Then after operation 508 evaluates true, operation 510 would only need to be performed to find the second delta (440A, 440B).

Operation 512 indicates that a difference between the first delta (438A, 438B) and the second delta (440A, 440B) is determined. Additional details on this process are discussed below in combination with FIGS. 9A and 9B.

Operation 514 indicates a test to see if the difference between the deltas is larger than a predetermined threshold. Referring to FIG. 4B, the first delta 438B and the second delta 440B should be about the same. Therefore, a difference between the first delta 438B and the second delta 440B would be very near zero. A small margin of error may be built in such that, for example only, the threshold may be set to about 0.1 volts. Thus, for the parallel data state of FIG. 4B, the difference would be near zero, which is less than the threshold and the process 500 would move to operation 520. The embodiment of FIG. 4B uses three sample points and to get to this point in the process 500, three sample points have already been collected so the evaluation signal would be at the maximum for this embodiment. Other embodiments with more sample points are discussed below in connection with FIG. 7. Since the evaluation signal is at the maximum, operation 522 indicates that the data state of the memory cell did not change and the process concludes that the data state of the memory cell is parallel. Operation 524 indicates that the memory cell may be reprogrammed (i.e., refreshed) to the parallel data state if needed or desired.

Returning to operation 514, and also referring to FIG. 4A, if the difference between the first delta 438A and the second delta 440A is greater than the threshold, operation 516 indicates that the data state of the memory cell changed from anti-parallel to parallel and the process concludes that the data state of the memory cell was anti-parallel prior to the evaluation process 500. Since the data state of the memory cell was changed during the evaluation process 500, operation 518 indicates that the memory cell is programmed back to its original anti-parallel data state.

Operations 510 and 512 find a difference between deltas. This difference of deltas may be represented mathematically by referring to the voltages of the sensed responses with the first response 432 as V1, the second response 434 as V2 and the third response 436 as V3, the first delta 438 as $\Delta 1$, and the second delta 440 as $\Delta 2$. Thus, $\Delta 1 = V2 - V1$ and $\Delta 2 = V3 - V2$. The difference of deltas can be expressed as:

$$\text{difference of deltas} = \Delta 1 - \Delta 2$$
$$= (V2 - V1) - (V3 - V2)$$
$$= 2V2 - V3 - V1$$

As can be seen, in FIG. 4B, $\Delta 1$ and $\Delta 2$ will be about equal so the difference of deltas will be about zero. As a non-limiting example, if $\Delta 1$ is about 0.4 and $\Delta 2$ is about 0.39, the difference of deltas would be about 0.01.

In contrast, from FIG. 4A one can see that $\Delta 2$ will be relatively small (or possibly even negative), whereas $\Delta 1$ will be relatively large. As a non-limiting example, if $\Delta 1$ is about 0.4 and $\Delta 2$ is about 0.1, the difference of deltas would be about 0.3. Thus, setting a threshold of about 0.1 to 0.2 would leave good margin of error for detecting the difference between a parallel data state with a difference of deltas of about 0.01 and an anti-parallel data state with a difference of deltas of about 0.3.

While not illustrated, in some embodiments the sample points may be configured such that one sample occurs before the switch from the anti-parallel data state to the parallel data state. In such a scenario, the first delta would be small because it determines the difference of samples before and after the state switch. The second delta would be larger because both sample points would be along the parallel line 470, which is still a rising line, but with a slope smaller than the slope of the anti-parallel line 460.

FIGS. 4A and 4B, as well as the discussion of FIG. 5 thus far have assumed a substantially constant current ramp for the evaluation signal and the responses were sensed at about equidistant time periods. However, other evaluation signals are possible.

Figure 6A:
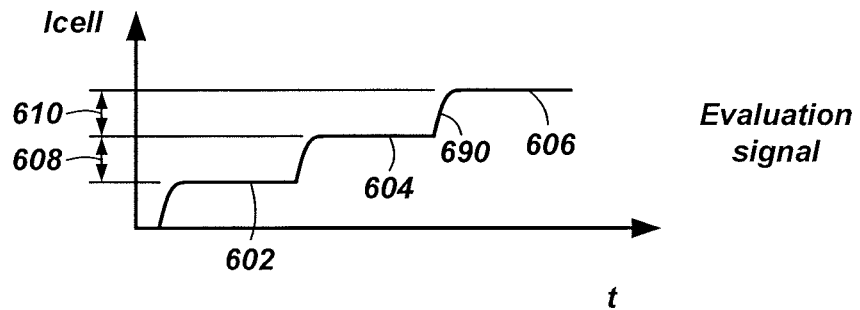
FIGS. 6A-6C illustrate evaluation signals and response signals of an STT RAM cell using a step approach for the evaluation signal.
Figure 6B:
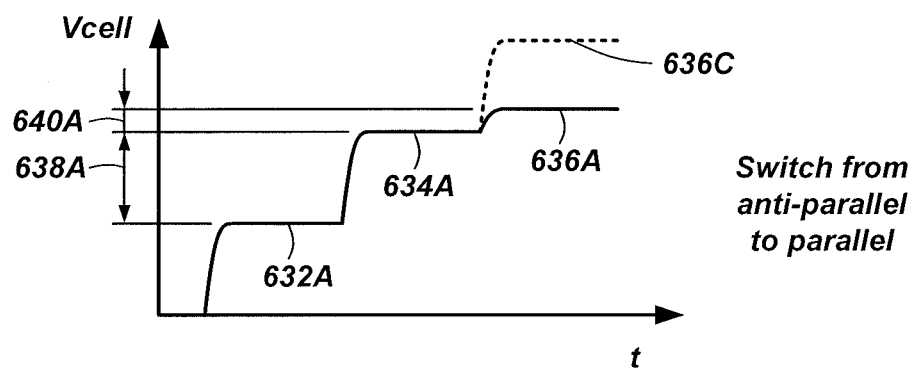
Figure 6C:
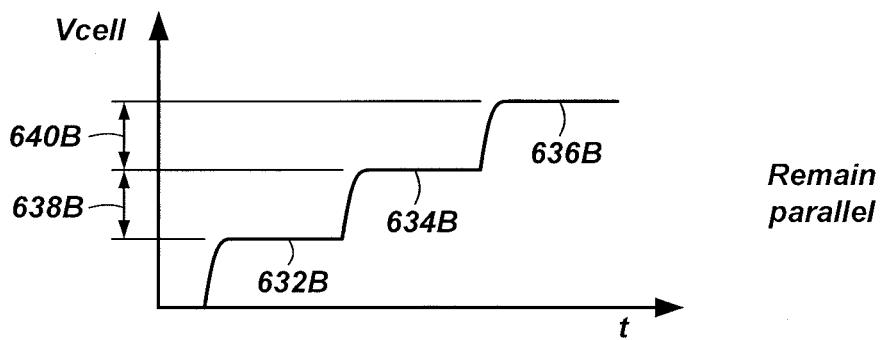

FIGS. 6A-6C illustrate evaluation signals and response signals of an STT RAM cell 200 (FIG. 2) using a step approach for the evaluation signal. The evaluation signal is shown in FIG. 6A and shows the evaluation signal stepping up to a first current level 602, then stepping up to a second current level 604, then stepping up to a third current level 606. In this example, the evaluation signal includes a first current delta 608 between the first current level 602 and the second current level 604 and a second current delta 610 between the second current level 604 and the third current level 606. If the evaluation signal is configured such that the first current delta 608 and the second current delta 610 are substantially equal, then the amount of time applied for each of the current steps need not be equal.

FIG. 6B illustrates a response of the STT RAM cell 200 (FIG. 2) to the stepped evaluation signal when the STT RAM cell 200 is originally in an anti-parallel data state. A first response 632A illustrates a voltage level that the STT RAM cell 200 will settle to in response to the first current level 602. A second response 634A illustrates a voltage level that the STT RAM cell 200 will settle to in response to the second current level 604. A third response 636A illustrates a voltage level that the STT RAM cell 200 will settle to in response to the third current level 606. A first delta 638A is the difference between the first response 632A and the second response 634A. A second delta 640A is the difference between the second response 634A and the third response 636A.

Recalling from the discussion of FIGS. 4A and 4B above, at a certain current level 690, the STT RAM cell 200 will switch from an anti-parallel data state at a relatively high resistance to a parallel data state at a relatively low resistance. As a result, when the switch occurs to the relatively low resistance, even though the step to the third current level 606 was a large step, the voltage step at the third response 636A is relatively small. Thus, the second delta 640A is small relative to the first delta 638A in a manner similar to the respective deltas 440A and 438A in FIG. 4A. Response 636C illustrates what the response of the STT RAM cell 200 would have been if the STT RAM cell 200 had remained in an anti-parallel data state at the third current level 606.

FIG. 6C illustrates a response of the STT RAM cell 200 (FIG. 2) to the stepped evaluation signal when the STT RAM cell 200 is originally in a parallel data state. A first response 632B illustrates a voltage level that the STT RAM cell 200 will settle to in response to the first current level 602. A second response 634B illustrates a voltage level that the STT RAM cell 200 will settle to in response to the second current level 604. A third response 636B illustrates a voltage level that the STT RAM cell 200 will settle to in response to the third current level 606. A first delta 638B is the difference between the first response 632B and the second response 634B. A second delta 640B is the difference between the second response 634B and the third response 636B.

Recalling from the discussion of FIGS. 4A and 4B above, when the STT RAM cell 200 is already in a parallel data state it does not switch states at higher currents. Thus, the second delta 640B is substantially the same size as the first delta 638B in a manner similar to the respective deltas 440B and 438B in FIG. 4B.

The evaluation process 500 illustrated in FIG. 5 is mostly the same for the stepped evaluation currents of FIGS. 6A-6C except that at each time operation 502 is entered, a delta step is added to the evaluation current. In the embodiments with a substantially linear ramp for the evaluation signal, the current on the evaluation signal would just continue to rise at its defined rate for operation 502.

Figure 7:
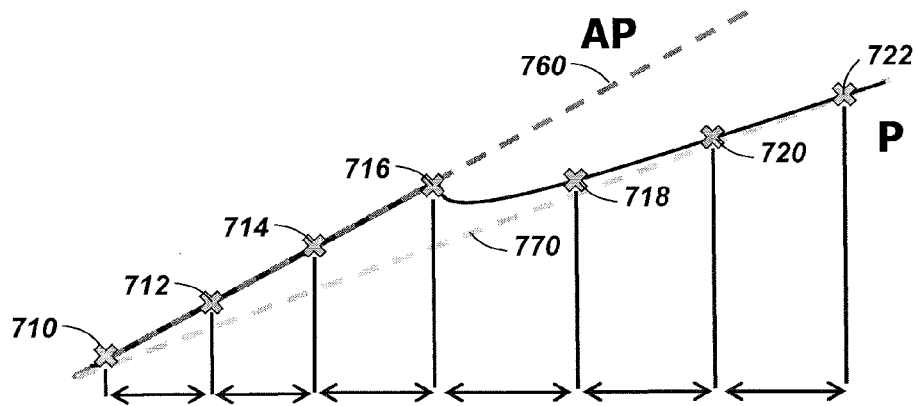
FIG. 7 illustrates a response of an STT RAM cell to an applied evaluation signal similar to that of FIGS. 4A and 4B and showing additional sample points.

FIG. 7 illustrates a response of an STT RAM cell to an applied evaluation signal similar to that of FIGS. 4A and 4B and showing additional sample points. FIGS. 4A and 4B showed a process using three sample points wherein two of the sample points were below and one sample point was above a current level needed to switch a memory cell from anti-parallel to parallel. In FIG. 7, multiple sample points are used and the switch from anti-parallel to parallel is detected between any two of the sample points.

A first dashed line 760 (also referred to as an ideal impedance line 760) indicates the ideal voltage response over time to the substantially linear current ramp applied to an STT RAM cell 200 (FIG. 2) programmed to an anti-parallel data state. A second dashed line 770 (also referred to as an ideal impedance line 770) indicates the ideal voltage response over time to the substantially linear current ramp applied to an STT RAM cell 200 programmed to a parallel data state. Responses 710, 712, 714, 716, 718, 720, and 722 show voltage responses at specific sample points over time, wherein the sample points are substantially equidistant in time.

Referring to FIGS. 7 and 5, the evaluation process 500 may also be adapted to the embodiment shown in FIG. 7. Thus, the loop of operations 502, 504, 506, and 508 is performed for the first three sample points 710, 712, and 714. After the three loops, operation blocks 510 and 512 will find the difference of deltas as discussed above.

At operation block 514, since sample points 710, 712, and 714 are all along the anti-parallel line, they will all be about equidistant in voltage and the difference of deltas value will evaluate to near zero and below the predefined threshold. As a result, operation block 520 will test to see if the evaluation signal has reached a maximum value. Since the evaluation signal has not reached a maximum value, control will pass back to operation 502 and a new sample, namely sample 716, will be sensed and saved as part of operations 504 and 506.

Operation blocks 510 and 512 will once again find the difference of deltas as discussed above (e.g., the difference between the last determined delta and the second to the last determined delta). Since sample points 712, 714, and 716 are all along the anti-parallel line, they will all be about equidistant in voltage and the difference of deltas value will evaluate to near zero and below the predefined threshold as determined at operation 514. Since the evaluation signal has not reached a maximum value at operation 520, control will pass back to operation 502 and a new sample, namely sample 718, will be sensed and saved as part of operations 504 and 506. Operation blocks 510 and 512 will once again find the difference of deltas as discussed above. However, this time through the loop the difference of deltas will evaluate above the threshold because the first delta (between sample points 716 and 714) is much larger than the second delta (between sample points 718 and 716). As a result, operation block 516 indicates that the data state of the memory cell has changed from anti-parallel to parallel and the evaluation process 500 concludes that the data state of the memory cell was anti-parallel prior to the evaluation process 500. Since the data state of the memory cell was changed during the evaluation process 500, operation block 518 indicates that the memory cell is programmed back to its original anti-parallel data state. At this stage, it is possible to interrupt the process for determining the data state. In other words, since there has been a state change, the data state has been determined and additional sampling may not be necessary. As a result, the sampling process can be shortened to a number of samples smaller than the maximum.

A drawing is not included for multiple sample points of a memory cell that is initially programmed in a parallel data state. However, a person of ordinary skill in the art is able to easily see that it would be similar to FIG. 4B, but with more sample points. Moreover, since the memory cell will not change state during the evaluation process, the sample points will always be about equidistant in voltage such that the difference of deltas determination at operations 510 and 512 will always evaluate to near zero. Thus, after the first three samples are collected, the loop of operations 502, 504, 506, 508, 510, 512, 514, 516 will continue until operation 520 determines that the evaluation signal has reached its maximum value. Since the evaluation signal is at the maximum, operation block 522 indicates that the data state of the memory cell did not change and the process concludes that the data state of the memory cell is parallel. Operation block 524 indicates that the memory cell may be reprogrammed (i.e., refreshed) to the parallel data state if needed or desired.

While not specifically illustrated in the drawings, a person of ordinary skill in the art can also easily understand that the process of using more than three sample points can be used with the stepped currents for the evaluation signal similar to those illustrated in FIGS. 6A-6C as well as the substantially constant current ramp illustrated in FIGS. 4A, 4B, and 7.

Figure 8:
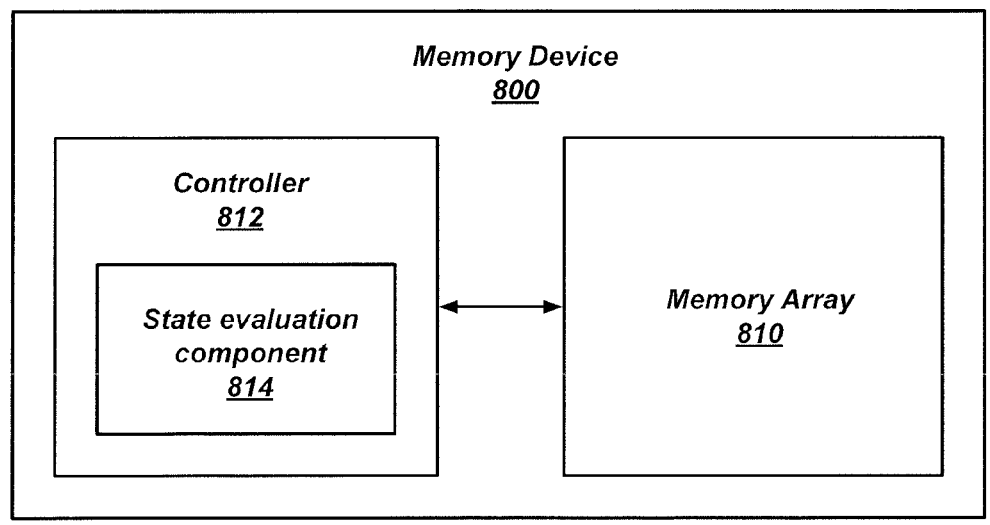
FIG. 8 illustrates a block diagram of an apparatus in the form of a memory device according to embodiments of the present disclosure.

FIG. 8 illustrates a block diagram of an apparatus in the form of a memory device 800 according to embodiments of the present disclosure. As shown in FIG. 8, the memory device 800 includes a controller 812 coupled to a memory array 810.

The memory array 810 can be analogous to, for example, the memory array 100 previously described in connection with FIG. 1. Although one memory array 810 is shown in FIG. 8, embodiments of the present disclosure are not so limited (e.g., the memory device 800 can include more than one memory array 810 coupled to one or more controllers 812).

The controller 812 can include, for example, control circuitry, firmware, or a combination thereof. The controller 812 can be included on the same physical device (e.g., the same die) as the memory array 810, or can be included on a separate physical device that is communicatively coupled to the physical device that includes the memory array 810. For example, the controller 812 can be a controller of an array testing apparatus (e.g., a controller 812 used to perform testing operations on memory arrays such as memory array 810).

In one example, the controller 812 includes a state evaluation component 814. The state evaluation component 814 may include control circuitry and/or firmware to determine changes and/or differences in sense signals associated with memory cells in the memory array 810. The state evaluation component 814 can be included on the same physical device (e.g., the same die) as the memory array 810, or can be included on a separate physical device that is communicatively coupled to the memory device 800 that includes the memory array 810. As non-limiting examples, circuitry associated with a number of example state evaluation components 814 is illustrated in FIGS. 9A and 9B.

The controller 812 can apply a number of signals in accordance with a number of embodiments of the present disclosure to the memory cells (e.g., to the storage elements of the memory cells) in the memory array 810. For example, the controller 812 can apply the evaluation signal described above.

Embodiments similar to FIG. 8 may include additional circuitry that is not illustrated so as not to obscure embodiments of the present disclosure. For example, the memory device 800 can include address circuitry to latch address signals provided over Input/Output (I/O) connectors through I/O circuitry. Address signals can be received and decoded by a row decoder and a column decoder, to access the memory array 810. As an additional example, the memory device 800 can include sense (e.g., read) circuitry (e.g., circuitry in addition to the state evaluation component 814).

Figure 9A:
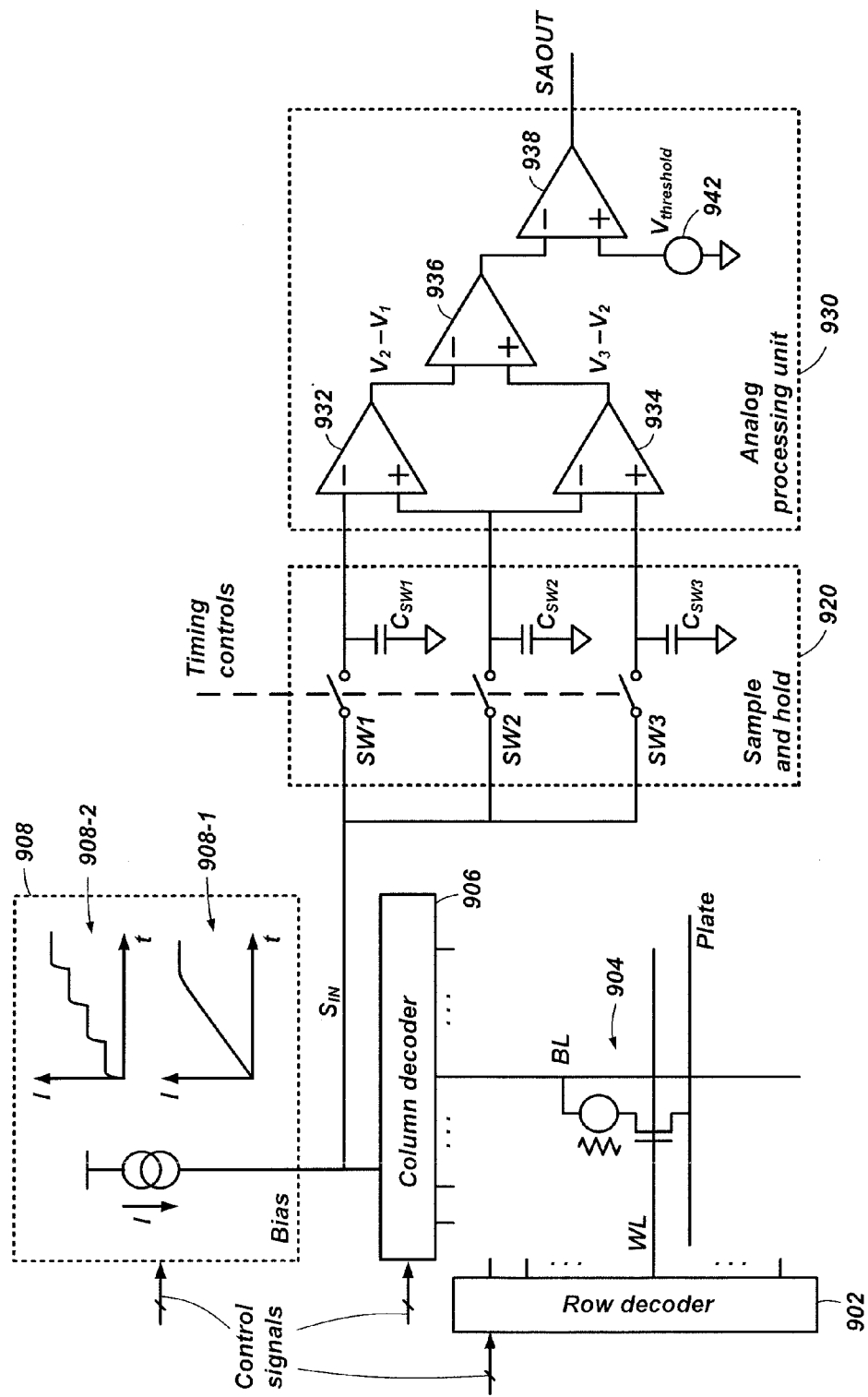
FIG. 9A illustrates a simplified circuit diagram of a mostly analog embodiment for differential slope determination according to embodiments of the present disclosure.
Figure 9B:
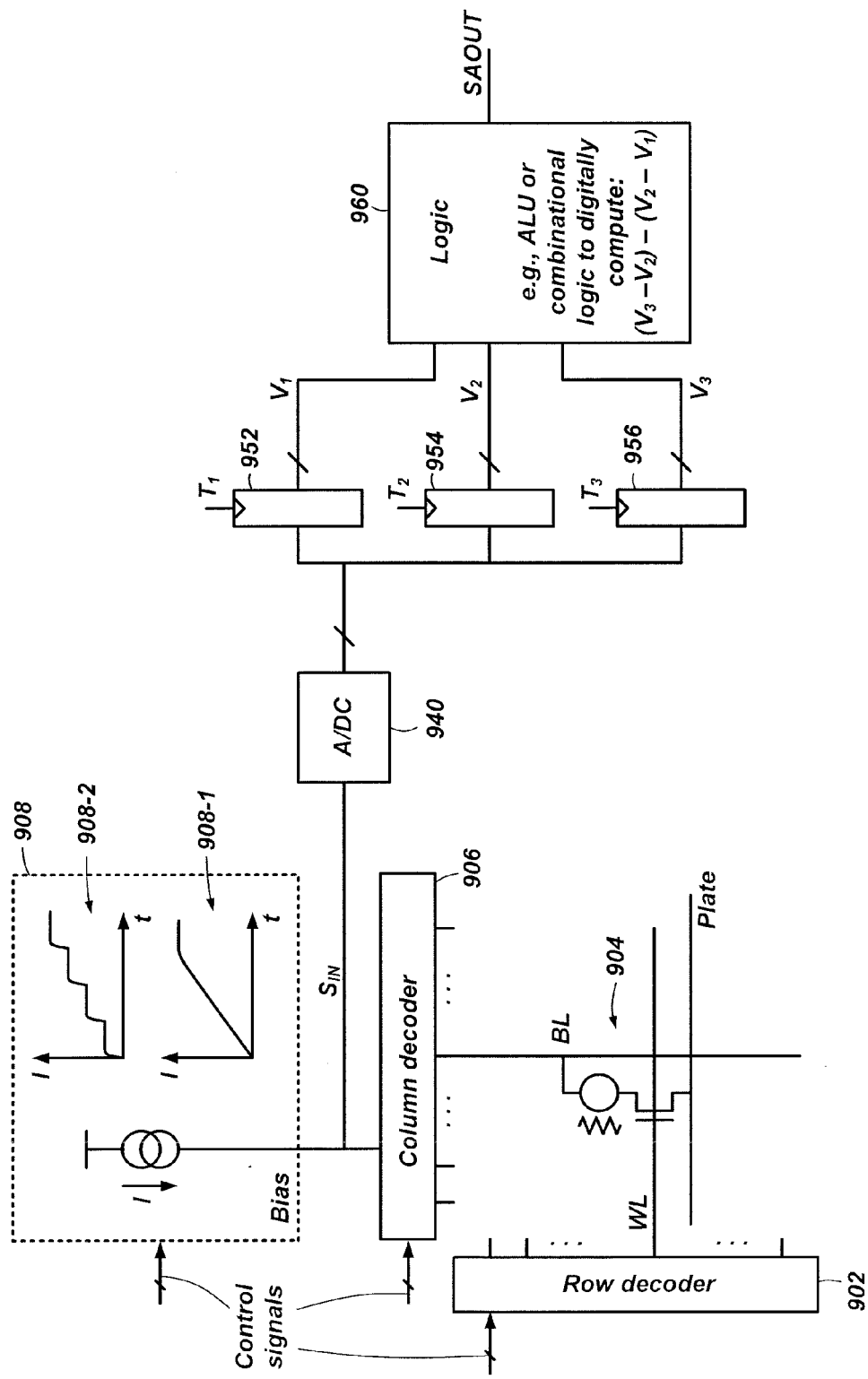
FIG. 9B illustrates a simplified circuit diagram of a mostly digital embodiment for differential slope determination according to embodiments of the present disclosure.

FIG. 9A illustrates a simplified circuit diagram of a mostly analog embodiment for differential slope determination according to embodiments of the present disclosure.

FIG. 9B illustrates a simplified circuit diagram of a mostly digital embodiment for differential slope determination according to embodiments of the present disclosure. Some of the circuitry is common between the two embodiments of FIGS. 9A and 9B. A resistance variable memory cell 904, including an access transistor is shown coupled to a bit line (BL), a word line (WL) and a plate (i.e., similar to the source line 230 in FIG. 2). A column decoder 906 drives the bit line and a row decoder 902 drives the word line. A bit line driver 908 may be used to supply programming signals during write operations and the evaluation signal during evaluation operations. FIG. 9A illustrates a current versus time plot 908-1 for the substantially linear slope version of the evaluation signal and a current versus time plot 908-2 for the stepped version of the evaluation signal. The signal labeled $S_{IN}$ between the bit line driver 908 and the column decoder 906 may be used as the signal for performing the various sensing operations described above.

Referring to FIG. 9A, the $S_{IN}$ signal may be sampled by sample and hold circuitry 920. As a non-limiting example, SW1 is coupled to $C_{SW1}$, SW2 is coupled to $C_{SW2}$, and SW3 is coupled to $C_{SW3}$. The switches SW1, SW2, and SW3 may be controlled by timing control signals to allow the $S_{IN}$ signal to charge respective capacitors $C_{SW1}$, $C_{SW2}$, and $C_{SW3}$ at specific sample times.

An analog processing unit 930 may include amplifiers 932, 934, 936 and comparator 938. A threshold generator 942 may be configured to generate the threshold voltage discussed above in connection with the evaluation process 500 of FIG. 5. The amplifiers 932, 934, and 936 are illustrated in a simplified form and may include other circuitry, such that the amplifiers 932, 934, and 936 can perform a differencing function to find the difference in voltage between the two inputs.

In operation, and referring also to FIGS. 4A and 4B, at the first sample point 402, SW1 is closed to charge capacitor $C_{SW1}$ to the voltage on the $S_{IN}$ signal and then opened again to hold the voltage. At the second sample point 404, SW2 is closed to charge capacitor $C_{SW2}$ to the voltage on the $S_{IN}$ signal and then opened again to hold the voltage. At the third sample point 406, SW3 is closed to charge capacitor $C_{SW3}$ to the voltage on the $S_{IN}$ signal and then opened again to hold the voltage. The timing of closing the switches SW1, SW2, SW3 for sampling the voltage and opening them for holding the voltage for the various sample points may be controlled differently depending on whether the evaluation signal is embodied in a current step or a substantially constant slope as discussed above.

Referring to FIG. 9A, and with continued reference to FIGS. 4A and 4B, amplifier 932 finds the first delta 438 between the first response on the $C_{SW1}$ capacitor and the second response on the $C_{SW2}$ capacitor. Similarly, amplifier 934 finds the second delta 440 between the second response on the $C_{SW2}$ capacitor and the third response on the $C_{SW3}$ capacitor. Amplifier 936 finds the difference of deltas as a difference between the first delta output by amplifier 932 and the second delta output by amplifier 934. The difference of deltas output by amplifier 936 is compared to the threshold voltage at comparator 938 and the resulting signal SAOUT digitally indicates whether the memory cell was programmed in an anti-parallel data state or a parallel data state.

Referring to FIG. 9B, the $S_{IN}$ signal may be coupled to an analog-to-digital (A/D) converter 940, which is coupled to registers 952, 954, and 956, which are configured to sample the output of the A/D converter 940 at specific sample times $T_1$, $T_2$, and $T_3$. A logic block 960 may be configured with digital logic in the form of combinatorial logic or arithmetic units to perform calculations for arriving at the difference of deltas result as discussed above.

In operation, and referring also to FIGS. 4A and 4B, a first register 952 is clocked at sample time $T_1$ to sample the output of the A/D converter 940 at the first sample point 402. A second register 954 is clocked at sample time $T_2$ to sample the output of the A/D converter 940 at the second sample point 404. A third register 956 is clocked at sample time $T_3$ to sample the output of the A/D converter 940 at the third sample point 406. With digital values for each of the three responses at the three different sample points, the logic block 960 computes the difference of deltas as SAOUT, which digitally indicates whether the memory cell was programmed in an anti-parallel data state or a parallel data state.

Other forms of the registers are possible. As a non-limiting example, if timing permits, the registers 952, 954, 956 may be configured as a shift register to capture a sample of the A/D converter 940 at each sample point and shift the previous samples down the shift register. This configuration may be particularly useful for the multiple sample embodiments of FIG. 7 where only the final three samples may be needed to calculate the proper difference of deltas.

Of course, many other circuit configurations may be used to accomplish the evaluation process and FIGS. 9A and 9B are presented as just two examples of how the process may be implemented. Particularly, the sampling and timing of the sampling may be modified to capture additional sample points for embodiments such as those discussed above with reference to FIG. 7.

As stated earlier, in this description significant detail has been presented for STT RAM cells as one example of a resistance variable memory cell that may be used in embodiments of the present disclosure. However, embodiments are not so limited. Embodiments of the present disclosure may be used with many types of resistance variable memory cells that exhibit different resistance levels for different data states and that will switch from one resistance level to another resistance level in response to an evaluation signal for at least one of the data states.

In some embodiments, an apparatus can include an array of resistance variable memory cells and a controller coupled to the array and configured to determine a data state of a memory cell in the array of resistance variable memory cells. The controller is configured to apply an evaluation signal to the memory cell, the evaluation signal including a current that goes above a threshold current sufficient to cause the memory cell to switch from a first resistance to a second resistance. The controller is configured to sense a first response from the memory cell responsive to the evaluation signal at a first sample point, sense a second response from the memory cell responsive to the evaluation signal at a second sample point, and sense a third response from the memory cell responsive to the evaluation signal at a third sample point. The controller is configured to determine a first delta between the first response and the second response and determine a second delta between the second response and the third response (or vice versa if alternate signs are desired as discussed above with reference to the discussions of FIGS. 4A and 4B). The controller is further configured to determine whether the memory cell changes from the first resistance to the second resistance during application of the evaluation signal responsive to a difference between the first delta and the second delta.

In embodiments specific to STT RAM cells, a method for sensing a memory cell can include applying an evaluation signal to a Spin Torque Transfer (STT) memory cell, the evaluation signal sufficient to cause the STT memory cell to switch from an anti-parallel state to a parallel state at a threshold current. Responses of the STT memory cell to the evaluation signal are sensed by sensing a first response at a first sample point, sensing a second response at a second sample point, and sensing a third response at a third sample point. A combined response is determined as two times the second response less the first response and less the third response. The method determines that the STT memory cell was in the anti-parallel state if the combined response is greater than a predefined threshold and determines that the STT memory cell was in the parallel state if the combined response it less than the predefined threshold.

The embodiments of the disclosure described above and illustrated in the accompanying drawing figures do not limit the scope of the invention, since these embodiments are merely examples of embodiments of the disclosure. The invention is defined by the appended claims and their legal equivalents. Any equivalent embodiments lie within the scope of this disclosure. Indeed, various modifications of the present disclosure, in addition to those shown and described herein, such as alternative useful combinations of the elements described, will become apparent to those of ordinary skill in the art from the description. Such modifications and embodiments also fall within the scope of the appended claims and their legal equivalents.

What is claimed is:

1. A method for sensing a resistance variable memory cell, comprising:
   applying an evaluation signal to a resistance variable memory cell, the evaluation signal configured to cause the resistance variable memory cell to switch from a first data state to a second data state at a threshold current;
   sensing three or more responses of the resistance variable memory cell at three or more different sample points in time during application of the evaluation signal to the resistance variable memory cell; and
   analyzing the three or more responses to determine whether the resistance variable memory cell changes from the first data state to the second data state during the application of the evaluation signal to the resistance variable memory cell.

2. The method of claim 1, wherein analyzing the three or more responses to determine whether the resistance variable memory cell changes from the first data state to the second data state comprises:
   determining a first change in voltage potential between a first pair of the three or more responses;
   determining a second change in voltage potential between a second pair of the three or more responses;
   determining an absolute difference between the first change in voltage potential and the second change in voltage potential; and
   determining that the memory cell changes from the first data state to the second data state during application of the evaluation signal responsive to the absolute difference being above a predetermined threshold.

3. The method of claim 1, wherein sensing the three or more responses of the resistance variable memory cell at the three or more different sample points in time comprises sensing the three or more responses of the resistance variable memory cell with sample and hold circuitry including three or more sample and hold elements.

4. The method of claim 1, wherein sensing the three or more responses of the resistance variable memory cell at the three or more different sample points in time comprises converting the responses of the resistance variable memory cell at the three or more different sample points in time to a digital signal, and recording the digital signal with a different one of the three or more registers at each of the three or more different sample points in time.

5. The method of claim 4, wherein recording the digital signal with a different one of the three or more registers at each of the three or more different sample points in time comprises clocking a different one of the three or more registers at each of the three or more different sample points in time.

6. The method of claim 1, wherein analyzing the three or more responses comprises processing the three or more responses with an analog processing unit.

7. The method of claim 5, wherein processing the three or more responses with an analog processing unit comprises applying the three or more responses to a network of differencing amplifiers to obtain an absolute difference voltage potential.

8. The method of claim 7, wherein processing the three or more responses with an analog processing unit further comprises applying the absolute difference voltage potential to a comparator configured to compare the absolute difference voltage potential to a threshold voltage potential.

9. The method of claim 1, wherein analyzing the three or more responses comprises applying the three or more responses to digital logic configured to determine whether the resistance variable memory cell changes from the first data state to the second data state during the application of the evaluation signal to the resistance variable memory cell.

10. A controller, comprising
   an electrical current driver configured to apply, to a resistance memory cell, an evaluation signal configured to cause the resistance variable memory cell to switch from a first data state to a second data state at a threshold current;
   sensing circuitry configured to sense three or more responses from the resistance variable memory cell responsive to the evaluation signal at three or more sample points in time;
   processing circuitry configured to determine whether the resistance variable memory cell changes from the first data state to the second data state during the application of the evaluation signal to the resistance variable memory cell.

11. The controller of claim 10, wherein the sensing circuitry comprises sample and hold circuitry.

12. The controller of claim 11, wherein the sample and hold circuitry comprises three or more charge capacitors, and three or more switches, each of the three or more switches configured to selectively couple a different one of the three or more charge capacitors to the resistance variable memory cell at each of the three or more sample points in time.

13. The controller of claim 10, wherein the sensing circuitry comprises an analog-to-digital converter configured to convert a voltage signal from the resistance variable memory cell to a digital signal.

14. The controller of claim 13, wherein the sensing circuitry further comprises three or more digital registers operably coupled to an output of the analog-to-digital converter, each of the three or more digital registers configured to store the digital signal from the analog-to-digital converter at a different one of the three or more different sample points in time.

15. The controller of claim 13, wherein the sensing circuitry further comprises a shift register configured to capture a sample of the digital signal at each of the three or more different sample points in time.

16. The controller of claim 10, wherein the processing circuitry comprises two or more differencing amplifiers configured to compute differences between pairs of the three or more responses and output difference voltage potentials corresponding to the differences between the pairs of the three or more responses.

17. The controller of claim 16, further comprising an additional difference amplifier configured to compute a difference between the difference voltage potentials and output an absolute difference voltage potential corresponding to the difference between the difference voltage potentials.

18. The controller of claim 17, further comprising a comparator including a first input operably coupled to a threshold voltage potential and a second input operably coupled to an output of the additional difference amplifier and configured to receive the absolute difference voltage potential.

19. The controller of claim 10, wherein the processing circuitry comprises digital logic configured to determine whether the resistance variable memory cell changes from the first data state to the second data state during the application of the evaluation signal to the resistance variable memory cell.

20. The controller of claim 19, wherein the digital logic is configured to:
   digitally compute at least a first delta between a first pair of the three or more responses and a second delta between a second pair of the three or more responses; and
   digitally compute an absolute difference by computing a difference between the first delta and the second delta.

21. The controller of claim 19, wherein the digital logic comprises at least one of combinatorial logic and digital arithmetic units.

* * * * *